US011791771B2

(12) United States Patent
Xiao et al.

(10) Patent No.: US 11,791,771 B2
(45) Date of Patent: Oct. 17, 2023

(54) OSCILLATOR CALIBRATION METHOD, ELECTRONIC DEVICE AND CHIP

(71) Applicant: FocalTech Electronics (Shenzhen) Co., Ltd., Shenzhen (CN)

(72) Inventors: Bei Xiao, Guangdong (CN); Xiao-Lin Huang, Guangdong (CN); Zhi-Qiang Luo, Guangdong (CN)

(73) Assignee: FocalTech Electronics (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 17/899,986

(22) Filed: Aug. 31, 2022

(65) Prior Publication Data

US 2023/0066799 A1 Mar. 2, 2023

(30) Foreign Application Priority Data

Sep. 1, 2021 (CN) .......................... 202111020815.2

(51) Int. Cl.
*H03B 5/04* (2006.01)
*H03B 5/30* (2006.01)
*H03K 21/02* (2006.01)

(52) U.S. Cl.
CPC ................. *H03B 5/04* (2013.01); *H03B 5/30* (2013.01); *H03K 21/02* (2013.01)

(58) Field of Classification Search
CPC ....................................................... H03B 5/44

USPC .......................................................... 331/44
See application file for complete search history.

(56) References Cited

U.S. PATENT DOCUMENTS 7,907,020 B2 * 3/2011 Wilson .................... H03L 7/085
331/16
2010/0122106 A1 * 5/2010 Lee ........................... G06F 1/12
713/503

FOREIGN PATENT DOCUMENTS

CN 104901687 B 4/2018

\* cited by examiner

*Primary Examiner* — Joseph Chang
(74) *Attorney, Agent, or Firm* — ScienBiziP, P.C.

(57) ABSTRACT

A method for calibrating a first clock signal output by an oscillation module to obtain a calibrated second clock signal includes obtaining a first count value by counting a third clock signal of an external device. A second count value is obtained by counting a scan signal of the oscillation module, and a first cycle ratio is obtained based on the first count value and the second count value. It is determined whether the first clock signal has a frequency deviation by comparing the first cycle ratio with a reference cycle ratio. A frequency division coefficient of the oscillation module is adjusted when the first clock signal has the frequency deviation, so that the oscillation module divides a frequency of the first clock signal according to the adjusted frequency division coefficient, thereby obtaining the calibrated second clock signal.

12 Claims, 4 Drawing Sheets

OSCILLATOR CALIBRATION METHOD, ELECTRONIC DEVICE AND CHIP

FIELD

The present disclosure relates to a chip field, in particular to an oscillator calibration method, an electronic device, and a chip.

BACKGROUND

With a rapid development of the consumer electronics industry, applications of oscillator clock (OSC) signals have become more and more widely. The oscillator clock signal is generated by an oscillator and can be used for such as timing, counting, and signal synchronization of an oscillator module, so as to control working of systems and units being orderly and stably, and enables all signals in the system to achieve synchronous input and output, and ensuring that the information is accurate.

However, in the actual production process, the stability of the oscillator is very easily affected by a process environment. The main influencing factors include temperature, humidity, crystal impurities, power supply voltage stability, degree of ionization and so on. Many such factors can work together, resulting in different specifications of the oscillators, and resulting in a significant deviation (frequency deviation) in an OSC clock signal. In practical application scenarios, an OSC oscillator module with a problem of the frequency deviation have serious problems such as unstable operation, failure of synchronization between devices, and operation errors.

DETAILED DESCRIPTION

It should be noted that, in the embodiments of the present disclosure, "at least one" refers to one or more, and "a plurality of" refers to two or more. "And/or", which describes a relationship between associated objects, means that there can be three relationships. For example, A and/or B can mean: A alone exists, A and B exist at the same time, and B exists alone, where A, B can be singular or plural. The terms "first", "second", "third", "fourth", etc. (if present) in the description and claims of this disclosure and the drawings are used to distinguish between similar objects, not to describe a particular order or sequence.

In addition, it should be noted that the methods disclosed in the embodiments of the present disclosure or the methods shown in the flowcharts include one or more blocks for implementing the methods, and the plurality of blocks are not to deviate from the scope of the claims. The order of execution can be interchanged, and some of the blocks can also be omitted.

Figure 1:
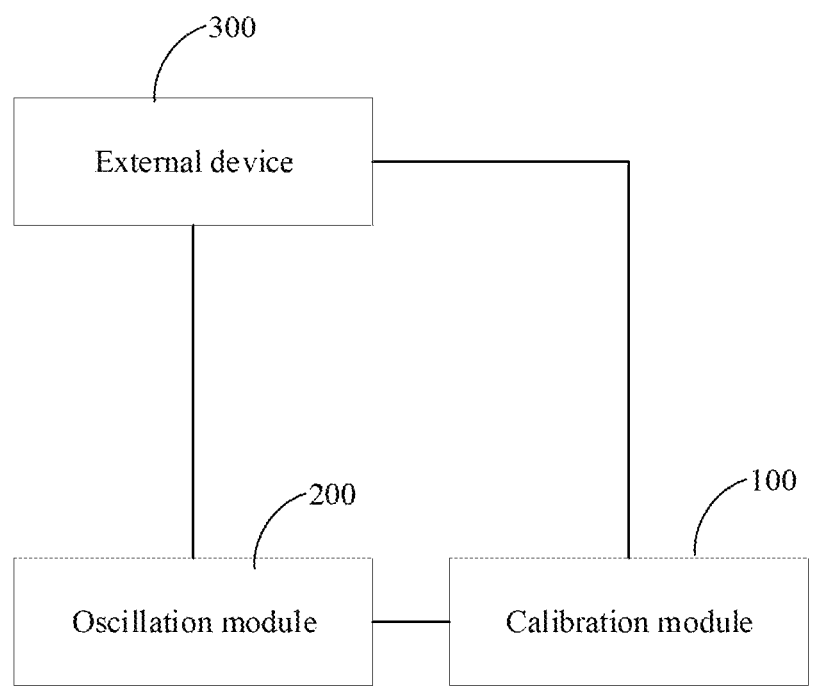
FIG. 1 illustrates a diagram of an application scenario of a calibration module provided by an embodiment of the present disclosure.

FIG. 1 illustrates a diagram of an application scenario of a calibration module 100 provided by an embodiment of the present disclosure. As shown in FIG. 1, the calibration module 100 is connected to an oscillation module 200 and an external device 300. The calibration module 100 calibrates a frequency of a clock signal of the oscillation module 200 according to a clock signal of the external device 300. The oscillation module 200 is connected to the external device 300 and is for obtaining a frequency of a clock signal of the external device 300.

In some embodiments, the oscillation module 200 may be disposed in an electronic device including a touch panel (TP), and the oscillation module 200 may be an analog front end (AFE) chip, which includes an oscillator, a frequency divider, a scanner, etc. The oscillator is an electronic component that converts direct current power into alternating current with a certain frequency. Optionally, the oscillator is a crystal oscillator for providing a stable first clock signal for the oscillation module 200, and a ratio of a frequency of the first clock signal to a frequency of the clock signal of the calibration module 100 is fixed under normal conditions. The frequency divider is used to divide the frequency of the first clock signal according to a frequency division coefficient, and output a second clock signal of a different frequency for use by other units such as the scanner. Specifically, the frequency of the second clock signal $F2=F1/x$, where $F1$ represents the first clock signal output by the oscillator, and x represents the frequency division coefficient, which can be determined by the frequency divider. For example, if the frequency of the first clock signal is 72 MHz and an operation frequency of the scanner is 360 kHz, the frequency divider can define the frequency division coefficient to be 200, and the frequency divider divides the first clock signal of 72 MHz into a second clock signal of 360 kHz and output the second clock signal to the scanner. The scanner is used for scanning the touch panel of the electronic device, and a frequency of a scan signal of the scanner is the same as the frequency of the second clock signal.

In some embodiments, the frequency of the first clock signal may vary or drift due to differences in oscillator aging, manufacturing processes, etc., as well as a temperature, a humidity, crystal impurities inside, a stability of a power supply voltage, a degree of ionization, etc., thereby deviating from an actual set frequency, and frequency deviation occurs. It can be understood that when the frequency of the first clock signal changes, if the frequency division coefficient does not change, the frequency of the clock signal output by the frequency divider will also deviate, so that other units that receive the deviated frequency may not work normally. Therefore, it is necessary to detect and calibrate the frequency of the first clock signal output by the oscillator.

In some embodiments, the external device 300 generates a third clock signal for reference by the calibration module 100. It can be understood that if the frequency of the first clock signal does not deviate, the frequency of the first clock signal and the frequency of the third clock signal can be relatively fixed, the frequency of the second clock signal is relatively stable, and the calibration module 100 does not need to perform calibration, and each unit can work normally. If the calibration module 100 detects that the frequency of the second clock signal has a frequency deviation, the oscillator of the oscillation module 200 can be calibrated according to the second clock signal and the third clock signal.

Figure 2:
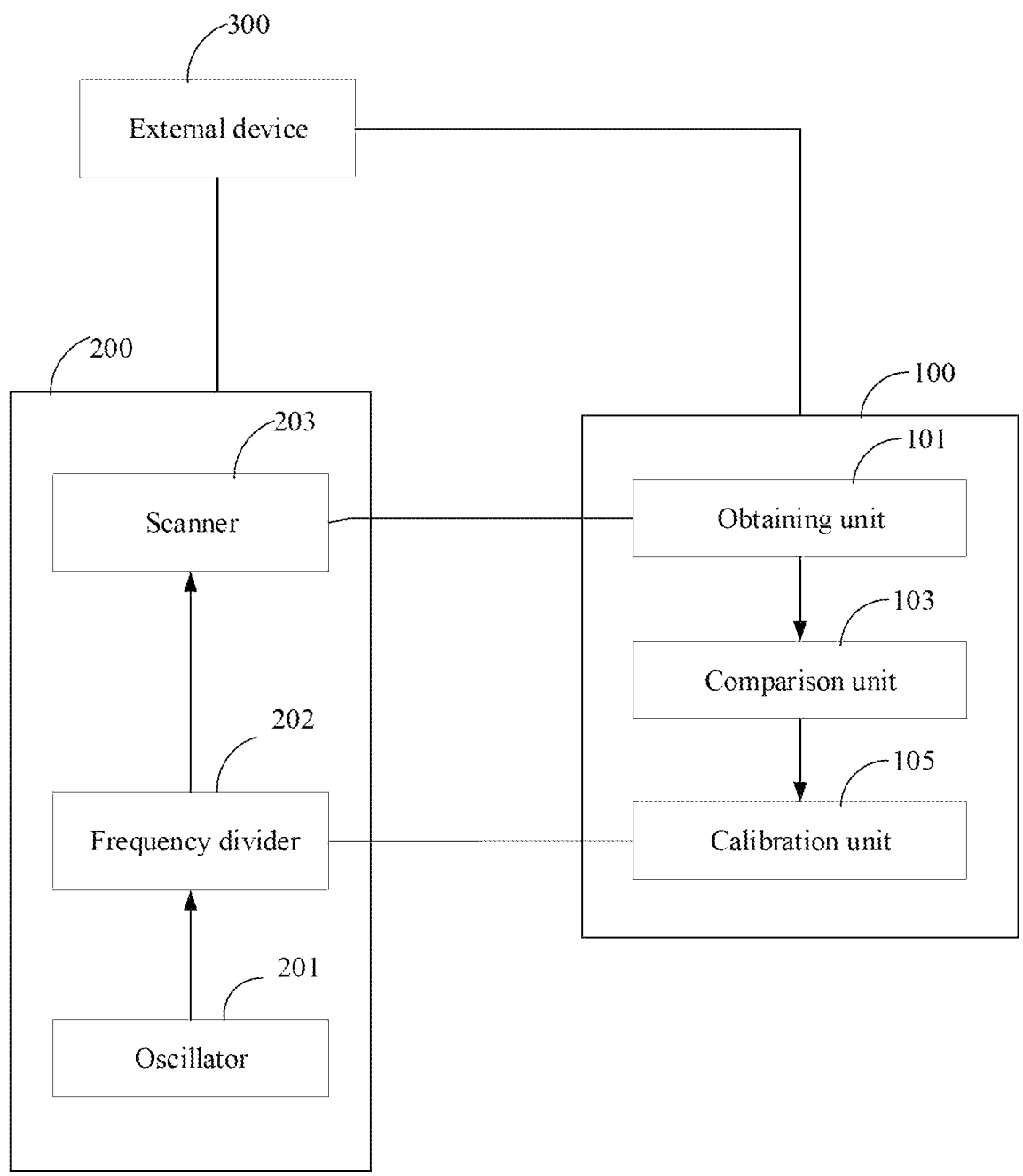
FIG. 2 illustrates a diagram of functional blocks of a calibration module provided by an embodiment of the present disclosure.

FIG. 2 illustrates a functional block diagram of the calibration module 100 provided by an embodiment of the present disclosure.

In this embodiment, the calibration module 100 may include a plurality of functional units composed of program code segments. The program codes of each program segment in the calibration module 100 may be stored in a storage device and executed by at least one processor to perform data processing functions.

In this embodiment, the calibration module 100 may be divided into the plurality of functional units according to the functions performed by the calibration module 100. The plurality of functional units may include: an obtaining unit 101, a comparison unit 103, and a calibration unit 105. The calibration module 100 is connected to the oscillation module 200, and the oscillation module 200 includes an oscillator 201, a frequency divider 202, and a scanner 203.

The obtaining unit 101 obtains a first period ratio Y1.

In this embodiment, the first cycle ratio Y1 is a ratio of N cycles of the third clock signal generated by the external device 300 to M cycles of the scan signal of the scanner 203 of the oscillation module 200. Where both M and N are positive integers. In one embodiment, the obtaining unit 101 can obtain the third clock signal from the external device 300; obtain a first count value COUNT1 by counting the third clock signal at a frequency of a fourth clock signal provided by a clock source (not shown) of the calibration module 100 within the N cycles of the third clock signal; and obtain a second count value COUNT2, at the same time, by counting the scan signal of the scanner 203 at the frequency of the fourth clock signal within the M cycles of the scan signal of the scanner 203. It can be understood that the first cycle ratio Y1 satisfies a following formula:

$$Y1 = \frac{COUNT1}{COUNT2} \quad (1)$$

The comparison unit 103 obtains a comparison result by comparing the first cycle ratio with a reference cycle ratio, determines whether the second clock signal has a frequency deviation according to the comparison result, and further determines whether the first clock signal has a frequency deviation.

In one embodiment, the reference cycle ratio is a ratio of N (N is a positive integer) cycles of the third clock signal generated by the external device 300 to M (M is a positive integer) cycles of the scan signal of the scanner 203 when the second clock signal has no frequency deviation. It can be understood that the reference cycle ratio YS satisfies a following formula:

$$YS = \frac{COUNT3}{COUNT4} \quad (2)$$

Wherein, COUNT3 represents a third count value that is obtained by the calibration module 100 by counting the third clock signal at the frequency of the fourth clock signal provided by the clock source (not shown) of the calibration module 100 within N cycles of the third clock signal. COUNT4 represents a fourth count value obtained by the calibration module 100 by counting the scan signal of the scanner 203 at the frequency of the fourth clock signal within M cycles of the scan signal of the scanner 203.

In some embodiments, the calibration module 100 can obtain a large number of reference cycle ratios based on the third clock signal and the scan signal when the second clock signal has no frequency deviation, and obtain the reference cycle ratio YS by averaging the large number of reference cycle ratios, or by performing another operation on the large number of reference cycle ratios.

The comparison unit 103 can determine whether the frequency of the first clock signal has the frequency deviation by comparing the first cycle ratio with the reference cycle ratio. In one embodiment, when the frequency of the third clock signal does not change, if the first cycle ratio is not equal to the reference cycle ratio, the comparison unit 103 can determine that the scan signal has the frequency deviation, and the second clock signal also has the frequency deviation. Since the frequency division coefficient does not change, the comparison unit 103 can determine that the first clock signal has the frequency deviation. Otherwise, the first clock signal has no frequency deviation.

If the reference cycle ratio is greater than the first cycle ratio, the comparison unit 103 can determine that a cycle of the scan signal becomes smaller and the frequency of the scan signal increases, indicating that the first clock signal has the frequency deviation and the frequency is larger.

If the reference cycle ratio is less than the first cycle ratio, the comparison unit 103 can determine that the cycle of the scan signal becomes larger and the frequency of the scan signal becomes smaller, indicating that the first clock signal has the frequency deviation and the frequency is relatively small.

The calibration unit 105 calculates a new frequency division coefficient when the first clock signal has the frequency deviation, and adjust the frequency division coefficient of the oscillation module according to the new frequency division coefficient.

In this embodiment, if the first clock signal has the frequency deviation, the calibration unit 105 may adjust the frequency division coefficient of the oscillation module. In one embodiment, according to formula (1) and formula (2), a ratio of the reference cycle ratio YS to the first cycle ratio Y1 satisfies the following formula:

$$\frac{YS}{Y1} = \frac{COUNT3}{COUNT4} \div \frac{COUNT1}{COUNT2} \quad (3)$$

It can be understood that since the cycle and frequency of a signal are reciprocal of each other, it is assumed that F1 represents a frequency of a calibrated first clock signal, F2 represents a frequency of a calibrated second clock signal, F3 represents a frequency of the third clock signal, and F4 represents the frequency of the fourth clock signal, and F represents the frequency of the clock signal of an uncalibrated second clock signal, then following formulas can be derived:

$$\frac{COUNT3}{COUNT4} = \frac{F2}{F3} \quad (4)$$

$$\frac{COUNT1}{COUNT2} = \frac{F}{F3} \quad (5)$$

According to formula (4) and formula (5), a following formula can be deduced:

$$\frac{YS}{Y1} = \frac{F2}{F3} \div \frac{F}{F3} = \frac{F2}{F} \quad (6)$$

According to formula (6), it can be understood that F satisfies a following formula:

$$F = F2 \div \frac{YS}{Y1} \quad (7)$$

It can be understood that a frequency F5 of an uncalibrated first clock signal satisfies a following formula:

$$F5 = x \times F \quad (8)$$

According to formula (8), the calibration unit 105 can obtain the new frequency division coefficient y, and y satisfies a following formula:

$$y = \frac{F5}{F2} \quad (9)$$

Combining formula (7) and formula (8), the calibration unit 105 can obtain the new frequency division coefficient $$y = x \times \frac{Y1}{YS}.$$

In this embodiment, if the second clock signal has the frequency deviation, the calibration unit 105 assigns the new frequency division coefficient y to the frequency divider 202 of the oscillation module 200, and the frequency divider 202 can calibrate the second clock signal by re-dividing the frequency of the first clock signal according to the new frequency division coefficient y, so as to ensure a normal operation of the scanner 203. In this way, the calibration module 100 provided by an embodiment of the present disclosure can determine whether the frequency of the second clock signal has the frequency deviation by comparing the first cycle ratio and the reference cycle ratio, so as to accurately calibrate the frequency of the second clock signal of the oscillation module by calculating the new frequency division coefficient.

Figure 3:
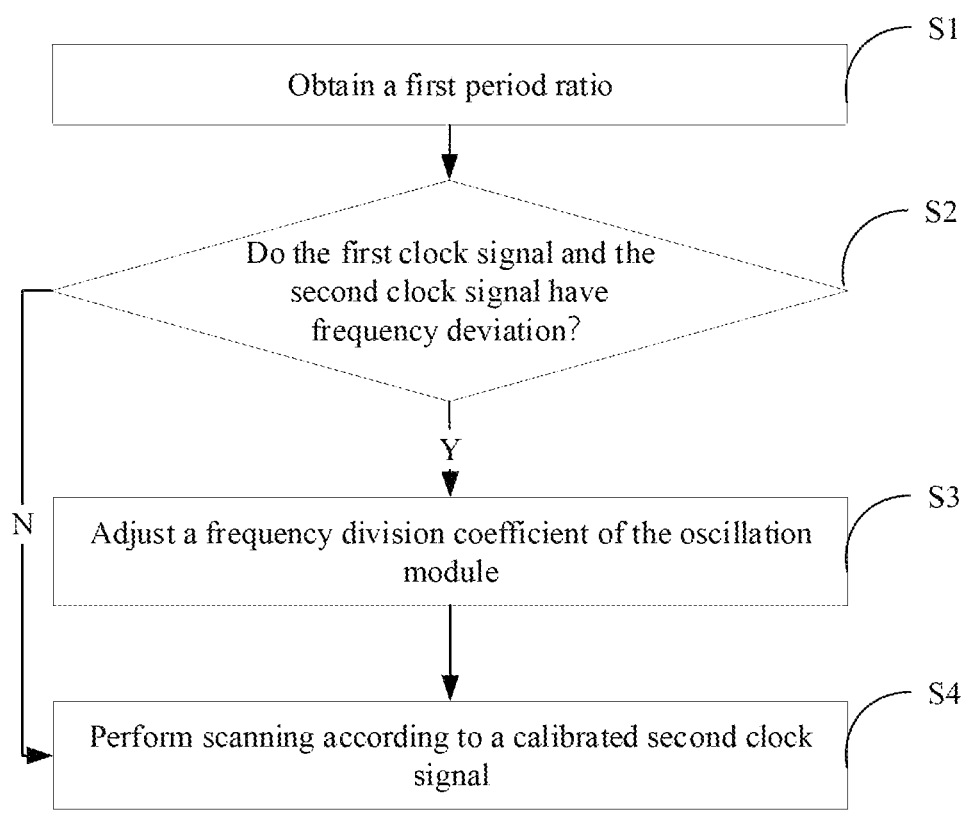
FIG. 3 illustrates a flowchart of an oscillator calibration method according to an embodiment of the present disclosure.

Please refer to FIG. 3, which shows a method for calibrating an oscillator provided by an embodiment of the present disclosure. As shown in FIG. 3, the oscillator is applied to the calibration module 100, and the method includes the following blocks:

Block S1, the calibration module 100 obtains the first cycle ratio.

In this embodiment, the first cycle ratio Y1 represents the ratio of N cycles of the third clock signal generated by the external device 300 to M cycles of the scan signal of the scanner 203 of the oscillation module 200. Where both M and N are positive integers. In one embodiment, the calibration module 100 can obtain the third clock signal from the external device 300; obtain the first count value COUNT1 by counting the third clock signal at the frequency of the fourth clock signal provided by the clock source (not shown) of the calibration module 100 within the N cycles of the third clock signal; and obtain the second count value COUNT2, at the same time, by counting the scan signal of the scanner 203 at the frequency of the fourth clock signal within the M cycles of the scan signal of the scanner 203. It can be understood that the first cycle ratio Y1 satisfies the formula (1).

Block S2, the calibration module 100 obtains the comparison result by comparing the first cycle ratio with the reference cycle ratio, determines whether the first clock signal and the second clock signal have the frequency deviation according to the comparison result.

In one embodiment, the reference cycle ratio is the ratio of N (N is the positive integer) cycles of the third clock signal generated by the external device 300 to M (M is the positive integer) cycles of the scan signal of the scanner 203, when the third clock signal has no frequency deviation. It can be understood that the reference cycle ratio YS satisfies the formula (2).

In some embodiments, the calibration module 100 can determine whether the frequency of the first clock signal has the frequency deviation by comparing the first cycle ratio with the reference cycle ratio. In one embodiment, when the frequency of the third clock signal does not change, if the first cycle ratio is not equal to the reference cycle ratio, the calibration module 100 can determine that the scan signal has the frequency deviation, and the second clock signal also has the frequency deviation. Since the frequency division coefficient does not change, the calibration module 100 can determine that the first clock signal has the frequency deviation. Otherwise, the first clock signal has no frequency deviation, and the process goes to block S4.

If the reference cycle ratio is greater than the first cycle ratio, the calibration module 100 can determine that the cycle of the scan signal becomes smaller and the frequency of the scan signal increases, indicating that the first clock signal has the frequency deviation and the frequency is larger.

If the reference cycle ratio is less than the first cycle ratio, the calibration module 100 can determine that the cycle of the scan signal becomes larger and the frequency of the scan signal becomes smaller, indicating that the first clock signal has the frequency deviation and the frequency is relatively small.

Block S3, the calibration module 100 adjusts the frequency division coefficient of the oscillation module.

In one embodiment, if the first clock signal has the frequency deviation, the calibration module 100 may calculate a range of the frequency deviation of the first clock signal according to the first cycle ratio and the reference cycle ratio, and calculate the new frequency division coefficient y according to the range of the frequency deviation. In one embodiment, the calibration module 100 obtains the new frequency division coefficient y according to formulas (1)-(9), and $$y = x \times \frac{Y1}{YS}.$$

x represents an original frequency division coefficient of the frequency divider 202.

In this embodiment, the calibration module 100 may assign the new frequency division coefficient y to the frequency divider 202, and the frequency divider 202 may re-divide the frequency of the first clock signal according to the new frequency division coefficient y.

Block S4, the scanner 203 performs scanning according to the calibrated second clock signal.

In this embodiment, after the frequency divider 202 divides the frequency of the first clock signal into the calibrated second clock signal by using the frequency division coefficient y, the scanner 203 scans the control panel at an operating frequency that is same to the frequency of the calibrated second clock signal.

By using the calibration module and the method for calibrating the oscillator provided by the embodiments of the present disclosure, it is possible to determine whether the frequency of the clock signal of the oscillator has the frequency deviation by comparing the first cycle ratio with the first cycle ratio, so that by calculating the new frequency division coefficient, to accurately calibrate the frequency of the clock signal of the oscillator module.

An embodiment of the present disclosure further provides a chip that integrates at least a first sub-chip and a second sub-chip, wherein the first sub-chip may include the oscillation module 200, and the second sub-chip may include the calibration module 100. It can be understood that the calibration module 100 in the second sub-chip can calibrate the first clock signal output by the oscillator of the oscillation module 200 in the first sub-chip according to the above method for calibrating the oscillator, and obtain the calibrated second clock signal.

In some embodiments, the first sub-chip may be an AFE chip, and the second sub-chip may be an MCU chip.

Figure 4:
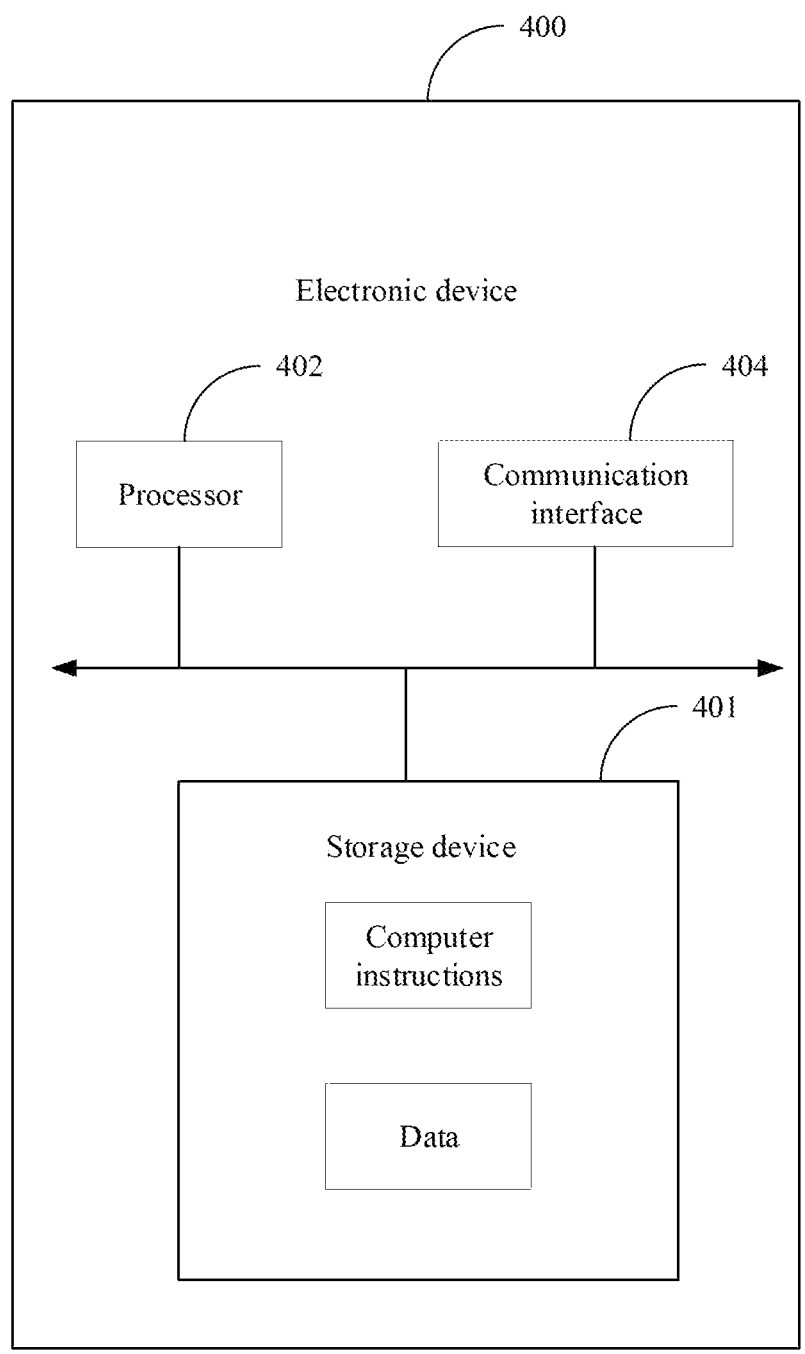
FIG. 4 illustrates a structural diagram of an electronic device according to an embodiment of the present disclosure.

Please refer to FIG. 4, FIG. 4 shows an electronic device 400 according to one embodiment of the present disclosure.

In one embodiment, the electronic device 400 includes a storage device 401, at least one processor 402, at least one communication bus 403 and a communication interface 404.

Those skilled in the art should understand that the structure of the electronic device 400 shown in FIG. 4 does not constitute a limitation of the embodiments of the present disclosure, and may be a bus-type structure or a star-shaped structure, and the electronic device 400 may also include more or less other hardware or software, or different arrangements of components are illustrated.

In some embodiments, the electronic device 400 is a device that can automatically perform numerical calculation and/or information processing according to pre-set or stored instructions, and its hardware includes but is not limited to microprocessors, application-specific integrated circuits, programmable gate arrays, digital processors and embedded devices. The electronic device 400 may also include a client device, which including but not limited to any electronic product that can interact with a client through a keyboard, a mouse, a remote control, a touchpad, or a voice-activated device, etc., for example, a personal computer, a tablet, a smartphone, a digital camera, etc.

It should be noted that the electronic device 400 is only an example, and other existing or future electronic products that can be adapted to the present disclosure should also be included within the protection scope of the present disclosure, and are incorporated herein by reference.

In some embodiments, the storage device 401 is used for storing program codes and various data, and realizes high-speed and automatic access to programs or data during the operation of the electronic device 400. The storage device 401 includes a read-only memory (ROM), a programmable read-only memory (PROM), and an erasable programmable read-only memory (EPROM), an one-time programmable read-only memory (OTPROM), an electronically erasable programmable read-only memory (EEPROM), a compact disc read-only memory (CD-ROM) or other optical disk storage, magnetic disk storage, magnetic tape storage, or any other computer-readable non-volatile storage medium that can be used to carry or store data.

In some embodiments, the at least one processor 402 may be composed of integrated circuits, for example, may be composed of a single packaged integrated circuit, or may be composed of multiple integrated circuits packaged with the same function or different functions, including one or a combination of multiple central processing units (CPUs), microprocessors, digital processing chips, graphics processors, and various control chips. The at least one processor 402 is a control unit of the electronic device 400, and uses various interfaces and lines to connect various components of the electronic device 400, and by running or executing the program or unit stored in the storage device 401, and call data stored in the storage device 401 to perform various functions of the electronic device 400 and process data.

In some embodiments, the at least one communication bus 403 is configured to enable connection communication between the storage device 401 and the at least one processor 402 and the like.

In some embodiments, the communication interface 404 uses any transceiver-like device for communicating with other devices or communication networks, such as Ethernet, Radio Access Network (RAN), Wireless Local Area Networks (WLAN), etc.

Although not shown, the electronic device 400 may also include a power source (such as a battery) for powering the various components. Optionally, the power supply may be logically connected to the at least one processor 402 through a power management device, so that functions such as charging, discharging, and power consumption management are implemented through the power management device. The power source may also include one or more DC or AC power sources, recharging devices, power failure detection circuits, power converters or inverters, power status indicators, and any other components. The electronic device 400 may further include various sensors, Bluetooth devices, etc., which will not be repeated here.

It can be understood that the embodiments are only used for illustration, and are not limited by this structure in the scope of the patent disclosure.

The above-mentioned integrated units implemented in the form of software functional units can be stored in a computer-readable storage medium. The above-mentioned software functional units are stored in the storage medium, and includes a plurality of instructions to enable a computer device (which may be a personal computer, an electronic device, or a network device, etc.) or a processor to execute the methods described in the various embodiments of the present disclosure.

In a further embodiment, with reference to FIG. 2, the at least one processor 402 can execute an operating system of the electronic device 400 and various installed applications (such as the calibration module 100), program codes, etc., for example, the above-mentioned units.

Program codes are stored in the storage device 401, and the at least one processor 402 can call the program codes stored in the storage device 401 to perform related functions. For example, each unit described in FIG. 2 is a program code stored in the storage device 401 and executed by the at least one processor 402, so as to realize the functions of the various units and achieve the purpose of calibrating the oscillator.

In one embodiment of the present disclosure, the storage device 401 stores a plurality of instructions, and the plurality of instructions are executed by the at least one processor 402 to implement the function of calibrating the oscillator.

Specifically, for the specific implementation method of the above instruction by the at least one processor 402, reference may be made to the description of the relevant blocks in the embodiment corresponding to FIG. 3, and details are not described herein.

In the several embodiments provided in this disclosure, it should be understood that the disclosed device and method may be implemented in other manners. For example, the device embodiments described above are only illustrative. For example, the division of the units is only a logical function division, and there may be other division manners in actual implementation.

Further, the computer-readable storage medium may be non-volatile or volatile.

Further, the computer-readable storage medium mainly includes a first area for storing programs and a second area for storing data, wherein the second area can store data created based on a usage of blockchain nodes.

The units described as separate components may or may not be physically separated, and components displayed as units may or may not be physical units, and may be located in one place or distributed to multiple network units. Some or all of the units may be selected according to actual needs to achieve the purpose of the solution in this embodiment.

In addition, each functional unit in each embodiment of the present disclosure may be integrated into a processing unit, or each unit may exist physically alone, or two or more units may be integrated into one unit. The above-mentioned integrated unit may be implemented in the form of hardware, or may be implemented in the form of hardware plus software functional units.

The embodiments of the present disclosure have been described in detail above in conjunction with the accompanying drawings, but the present disclosure is not limited to the above-mentioned embodiments, and within the scope of knowledge possessed by those of ordinary skill in the art, various aspects can also be made without departing from the purpose of the present disclosure. kind of change.

What is claimed is:

1. An oscillator calibration method for calibrating a first clock signal output by an oscillation module comprising a crystal oscillator to obtain a calibrated second clock signal, comprising:
    obtaining a first count value by counting a third clock signal of an external device, obtaining a second count value by counting a scan signal of the oscillation module, and obtaining a first cycle ratio, which is a ratio of the first count value to the second count value;
    obtaining a comparison result by comparing the first cycle ratio with a reference cycle ratio, and determining whether the first clock signal has a frequency deviation according to the comparison result; and
    adjusting a frequency division coefficient of the oscillation module in response that the first clock signal has the frequency deviation, make the oscillation module divide a frequency of the first clock signal according to the adjusted frequency division coefficient and obtain the calibrated second clock signal.

2. The method according to claim 1, wherein the counting the third clock signal of the external device comprises:
    counting the third clock signal at a frequency of a fourth clock signal within N cycles of the third clock signal.

3. The method according to claim 1, wherein the counting the scan signal of the oscillation module comprises:
    counting the scan signal of the oscillation module at a frequency of a fourth clock signal within M cycles of the scan signal.

4. The method according to claim 1, wherein the adjusting the frequency division coefficient of the oscillation module comprises:
    adjusting the frequency division coefficient of the oscillation module to be a product of a ratio of the first cycle ratio to the reference cycle ratio and an original frequency division coefficient.

5. A chip integrated a first sub-chip and a second sub-chip, the first sub-chip comprising an oscillation module, and the second sub-chip comprising a calibration module, the calibration module calibrating a first clock signal output by the oscillation module and obtaining a calibrated second clock signal; wherein calibrating the first clock signal output by the oscillation module and obtaining the calibrated second clock signal comprises:
    obtaining a first count value by counting a third clock signal of an external device, obtaining a second count value by counting a scan signal of the oscillation module, and obtaining a first cycle ratio, which is a ratio of the first count value to the second count value;
    obtaining a comparison result by comparing the first cycle ratio with a reference cycle ratio, and determining whether the first clock signal has a frequency deviation according to the comparison result; and
    adjusting a frequency division coefficient of the oscillation module in response that the first clock signal has the frequency deviation, make the oscillation module divide a frequency of the first clock signal according to the adjusted frequency division coefficient, and obtain the calibrated second clock signal.

6. The chip according to claim 5, wherein the counting the third clock signal of the external device comprises:
    counting the third clock signal at a frequency of a fourth clock signal within N cycles of the third clock signal.

7. The chip according to claim 5, wherein the counting the scan signal of the oscillation module comprises:
    counting the scan signal of the oscillation module at a frequency of a fourth clock signal within M cycles of the scan signal.

8. The chip according to claim 5, wherein the adjusting the frequency division coefficient of the oscillation module comprises:
    adjusting the frequency division coefficient of the oscillation module to be a product of a ratio of the first cycle ratio to the reference cycle ratio and an original frequency division coefficient.

9. An electronic device comprising:
    a storage device;
    at least one processor; and
    the storage device storing one or more programs, which when executed by the at least one processor, cause the at least one processor to:
    obtain a first count value by counting a third clock signal of an external device, obtain a second count value by counting a scan signal of the oscillation module, and obtain a first cycle ratio, which is a ratio of the first count value to the second count value;
    obtain a comparison result by comparing the first cycle ratio with a reference cycle ratio, and determine whether the first clock signal has a frequency deviation according to the comparison result; and
    adjust a frequency division coefficient of the oscillation module in response that the first clock signal has the frequency deviation, make the oscillation module divide a frequency of the first clock signal according to the adjusted frequency division coefficient, and obtain the calibrated second clock signal.

10. The electronic device according to claim 9, wherein the counting the third clock signal of the external device comprises:
 counting the third clock signal at a frequency of a fourth clock signal within N cycles of the third clock signal.

11. The electronic device according to claim 9, wherein the counting the scan signal of the oscillation module comprises:
 counting the scan signal of the oscillation module at a frequency of a fourth clock signal within M cycles of the scan signal.

12. The electronic device according to claim 9, wherein the adjusting the frequency division coefficient of the oscillation module comprises:
 adjusting the frequency division coefficient of the oscillation module to be a product of a ratio of the first cycle ratio to the reference cycle ratio and an original frequency division coefficient.

\* \* \* \* \*